United States Patent [19]
Fukami et al.

[11] Patent Number: 5,821,167
[45] Date of Patent: Oct. 13, 1998

[54] METHOD OF MANUFACTURING SEMICONDUCTOR MIRROR WAFERS

[75] Inventors: Teruaki Fukami; Hisashi Masumura; Kiyoshi Suzuki; Hideo Kudo, all of Fukushima-ken, Japan

[73] Assignee: Shin-Etsu Handotai Co., Ltd., Tokyo, Japan

[21] Appl. No.: 773,379

[22] Filed: Dec. 26, 1996

[30] Foreign Application Priority Data

Dec. 27, 1995 [JP] Japan .................................. 7-351768
Dec. 16, 1996 [JP] Japan .................................. 8-353210

[51] Int. Cl.⁶ .................................................. H01L 21/302
[52] U.S. Cl. ............................ 438/691; 438/692; 216/91
[58] Field of Search .................................. 438/690–693; 216/91, 92

[56] References Cited

U.S. PATENT DOCUMENTS

| | | | |
|---|---|---|---|
| 4,276,114 | 6/1981 | Takano et al. | 156/645 |
| 4,842,678 | 6/1989 | Noro et al. | 156/636 |
| 5,389,579 | 2/1995 | Wells . | |
| 5,429,711 | 7/1995 | Watanabe et al. | 216/52 |
| 5,447,890 | 9/1995 | Kato et al. | 437/249 |
| 5,516,706 | 5/1996 | Kusakabe | 437/12 |
| 5,679,212 | 10/1997 | Kato et al. | 156/636.1 |

FOREIGN PATENT DOCUMENTS

| | | |
|---|---|---|
| 0 588 055 A2 | 3/1994 | European Pat. Off. . |
| 0 628 992 A2 | 12/1994 | European Pat. Off. . |
| 0 685 877 A2 | 12/1995 | European Pat. Off. . |
| 0 808 3781 | 9/1994 | Japan . |

OTHER PUBLICATIONS

"Improved Geometry of Double–sided Polished Parallel Wafers Prepared for Direct Wafer Bonding", Jan Haisma et al. (Philips Research Laboratories, Philips Electronics) Applied Optics, vol. 33 No. 34 (Dec. 1994) pp. 7945–7954.

*Primary Examiner*—John Niebling
*Assistant Examiner*—Michael S. Lebentritt
*Attorney, Agent, or Firm*—Armstrong, Westerman, Hattori, McLeland & Naughton

[57] ABSTRACT

A method of manufacturing semiconductor mirror wafers includes a double side primary mirror polishing step, a back side low brightness polishing step and a front side final mirror polishing step, wherein a silica containing polishing agent is used together with a polyolefin type fine particle material for the back side low brightness polishing. The method is capable of low brightness polishing of the back side, sensor detection of the front and back sides, suppression of generation of fine dust or particles from back side, thereby to increase the yield of semiconductor devices, manufacturing mirror wafers with higher flatness level, and higher productivity due to simplification of processes.

18 Claims, 18 Drawing Sheets

1.0 mm

METHOD OF MANUFACTURING SEMICONDUCTOR MIRROR WAFERS

BACKGROUND OF THE INVENTION

1. Field of the Invention

The present invention relates to a method of manufacturing semiconductor mirror wafers, In particular, single-crystal silicon mirror wafers (hereinafter may be referred to, for brevity, as "mirror wafer") which become substrates for fabricating semiconductor devices.

2. Description of the Related Art

Generally, as shown in FIG. 21, the manufacturing method of semiconductor wafers includes a slicing step (A) to obtain wafers of thin disc shape by slicing a single crystal ingot formed by a pulling step using a crystal pulling machine; a chamfering step (B) to chamfer a peripheral edge portion of the wafer obtained through the slicing step (A) to prevent cracking or breakage of the wafer; a lapping step (C) to flatten the surface of the chamfered wafer by lapping it; an etching step (D) to remove processing damage of the so chamfered and lapped wafer; a primary mirror polishing step (El) to primarily polish one side of the etched wafer to obtain a primary mirror surface of the wafer; a final mirror polishing step (G) to finally polish the side of the so primarily mirror polished wafer to obtain a final mirror surface of the wafer; and a cleaning step (H) for cleaning the finally mirror polished wafer to remove the polishing agent or dust particles from its surface.

As the etching step (D), there are two types of steps, that is, an acid etching step using an acid etching solution of a mixed acid or the like and an alkaline etching step using an alkaline etching solution of NaOH or the like. In the acid etching step, as shown in FIG. 22, a relatively high etching rate is obtained, and surface roughness of an etched wafer is so fine that a cycle of the roughness Is less than 10 $\mu$m in frequency and a P-V (Peak to Valley) value thereof is smaller than 0.6 $\mu$m. On the contrary, in the alkaline etching step, as shown in FIG. 23, surface roughness of an etched wafer is so large that a cycle of the roughness is in the range of 10 to 20 $\mu$m in frequency and a P-V value thereof sometimes exceeds 1.5 $\mu$m. The alkaline etching is in the tendency which will be used more in the future because wafers having a higher flatness level compared with the acid etching can be obtained by the alkaline etching.

However, in the semiconductor wafer produced through the respective steps shown in FIG. 21, the following problem has been seen because the back side of the etched wafer is left as etched to the final stage.

After both the sides of the wafer are etched in the etching step, only the front side of the wafer is subjected to mirror polishing in the next mirror polishing step. The polished front side of the wafer is not chucked by as a vacuum chucking means and therefore offers no problem. However, when the back side of the etched wafer is chucked by such a chucking means, etched portions still remaining in the back side with relatively large surface roughness are chipped or broken to generate fine dust or a great number of fine particles, due to which the yield of semiconductor devices being degraded. This problem is remarkable in alkaline etched wafers.

Then, if both of the front and back sides of the wafer are mirror polished, the above-mentioned problem is canceled because the polished wafer having no large surface roughness may suppress to generate fine dust or a great number of fine particles.

According to the above-mentioned double side mirror polishing wherein both the front and back sides of the wafer are mirror polished, the steps of mirror polishing are doubled and since back side of the wafer is also mirror polished respective sensors of processing machines can not distinguish the front side from the back side. Further so mirror polished wafer tends to slip out during handling process. There have been no effective means capable of such low brightness polishing for semiconductor wafers that can satisfy the above sensor detection and wafer conveyance.

SUMMARY OF THE INVENTION

With the foregoing problems in view, it is an object of the present invention to provide a novel method of manufacturing semiconductor mirror wafers which is capable of low brightness polishing, sensing the difference between the front side and back side of the wafer, suppression of fine dust or particles generated by chipping of the back side of the wafer, thereby to increase the yield of semiconductor devices, higher productivity due to simplification of processes, higher flatness level wafer processing.

To attain the foregoing object, in one aspect, the present invention provides a method of manufacturing semiconductor mirror wafers including a polishing step which is in a wafer manufacturing process comprises the sub-steps of (a) double side primary mirror polishing of both front and back sides of a wafer, (b) single side low brightness polishing of the back side of the double side polished wafer, and (e) single side final mirror polishing of the front side of the single side low brightness polished wafer, wherein a semiconductor wafer polishing agent comprising a silica containing polishing agent as a main component and a polyolefin type fine particle material as an additive is used for the single side low brightness polishing of the wafer.

In another aspect, the present invention provides a method of manufacturing semiconductor mirror wafers including a wafer polishing step which is in a wafer manufacturing process comprises the sub-steps of (a) double side low brightness polishing of both front and back sides of a wafer, and (b) single side final mirror polishing of the front side of the double side low brightness polished wafer, wherein a semiconductor wafer polishing agent comprising a silica containing polishing agent as a main component and a polyolefin type fine particle material as an additive is used for the double side low brightness polishing of the wafer.

The wafer manufacturing process preferably comprises the steps of (a) slicing a single crystal ingot to form wafers of thin disc shape, (b) chamfering a peripheral edge portion of the sliced wafer, (c) lapping the chamfered wafer to flatten the surface thereof, (d) etching the chamfered and lapped wafer to remove processing deformation thereof, and (e) polishing the etched wafer.

In the third aspect, the present invention provides a method of manufacturing semiconductor mirror wafers which comprises the steps of (a) slicing a single crystal ingot to form wafers of thin disc shape, (b) chamfering a peripheral edge portion of the sliced wafer, (c) double side primary mirror polishing of both front and back sides of a wafer, (d) single side low brightness polishing of the back side of the double side polished wafer, and (e) single side final mirror polishing of the front side of the single side low brightness polished wafer, wherein a semiconductor wafer polishing agent comprising a silica containing polishing agent as a main component and a polyolefin type fine particle material as an additive is used for the single side low brightness polishing of the wafer.

In the fourth aspect, the present invention provides a method of manufacturing semiconductor mirror wafers which comprises the steps of (a) slicing a single crystal ingot to form wafers of thin disc shape, (b) chamfering a peripheral edge portion of the sliced wafer, (c) double side low brightness polishing of both front and back sides of the chamfered wafer, and (d) single side final mirror polishing of the front side of the double side low brightness polished wafer, wherein a semiconductor wafer polishing agent comprising a silica containing polishing agent as a main component and a polyolefin type fine particle material as an additive is used for the double side low brightness polishing of the wafer.

The silica containing polishing agent includes a colloidal silica polishing agent, and it is preferred to use a polyolefin aqueous dispersion as the polyolefin type fine particle material. The amount of the polyolefin type fine particle material is in the range of 0.01 to 1 percent by weight, preferably 0.01 to 0.5 percent by weight, and optimally 0.01 to 0.1 percent by weight relative to the total amount of the polishing agent.

The polyolefin type fine particle material or polyolefin aqueous dispersion includes the aqueous dispersions disclosed in Japanese Patent Laid-open Publication Nos.4-46904, 4-88025 to 88026, 4-89830 to 89832 and 4-218548 to 218549. Further, it is preferred to use CHEMIPEARL (trade name for a polyolefin aqueous dispersion manufactured by Mitsui Petrochemical Industries, Ltd.) which contains the above noted polyolefin type fine particle material or polyolefin aqueous dispersion.

The present invention has been accomplished on the basis of the findings that low brightness polishing can be achieved by forming the semi-spherical small projections having a diameter of 50 to 500 $\mu$m and a height of 0.05 to 0.5 $\mu$m in the back side of a semiconductor wafer which is polished using a silica containing polishing agent added with a polyolefin type fine particle material. Accordingly, by mirror polishing the front side of the wafer and low brightness polishing the back side of the wafer, difference in brightness occurs between the front and back sides thereof. Therefore, sensor detection of the front and back sides becomes possible. The term "brightness" denotes the percentage of the tested surface reflectance relative to 100 of the perfect mirror surface reflectance. In this specification, the term "low brightness polishing" is defined as mechanochemical polishing of wafers using polishing agents including specified materials which can form fine roughness on polished wafer surfaces without generation of processing damage.

Further, there can be suppressed the generation of dust from the back side of the wafer which is subjected to the low brightness polishing using the above silica containing polishing agent added with a polyolefin type fine particle material. For example, when the low brightness polished back side of the wafer is chucked in a photolithography process of a device manufacturing line, the generation of dust by chipping can be suppressed and thereby the yield of semiconductor devices can be increased.

In the conventional wafer manufacturing method, a lapping step is carried out in order to remove the process damage and to improve the very bad flatness (TTV; Total Thickness Variation) of the wafer introduced in the slicing step. The lapping step also affords a damage of several micrometers. The etching step is used for removing the damage of the wafer.

The inventors found by extended researches that the double side polishing can remove the process damage and to improve the very bad flatness (TTV) of the wafer introduced in the slicing step. As the double side polishing affords the wafer few damages, the etching step is not required as a matter of course. Further, the present inventors reached the third and fourth aspects of the present invention through the findings that combination of the double side polishing and low brightness polishing using a semiconductor wafer polishing agent which contains mainly a silica containing polishing agent and is added with a polyolefin type fine particle material.

The above and other objects, features and advantages of the present invention will become manifest to those versed in the art upon making reference to the detailed description and the accompanying sheets of drawings.

DETAILED DESCRIPTION

Figure 1:
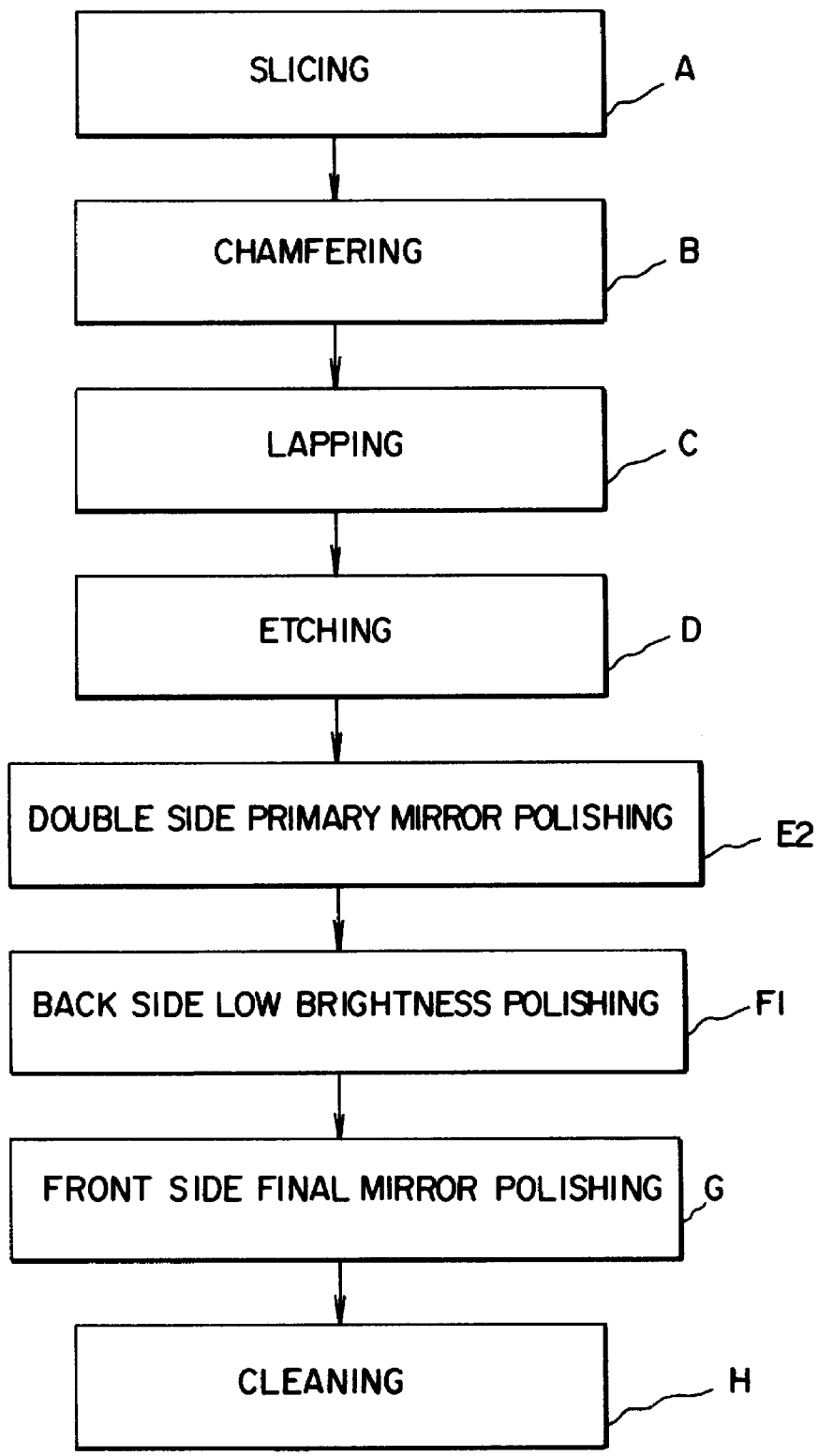
FIG. 1 is a flow chart showing the first embodiment of the present invention.

The present invention will be described below in greater detail by way of the following embodiments and examples which should be construed as illustrative rather than restrictive. In FIGS. 1–4, 16 and 17, these steps which are like or corresponding to those shown in FIG. 21 are designated by the corresponding reference characters.

FIG. 1 is a flow chart showing the first embodiment of the present invention. In a slicing step (A), a single crystal ingot formed by a pulling step using a crystal pulling machine (not shown) is sliced at a right angle or predetermined angle to an axial direction thereof to produce a plurality of wafers of thin disc shape. A peripheral edge portion of the wafer obtained through the slicing step (A) is chamfered in a chamfering step (B) to prevent cracking or breakage of the wafer, The chamfered wafer is lapped and flattened by a lapping machine (not shown) in a lapping step (c).

The lapped and flattened wafer is then subjected to alkaline etching in an etching step using 45% solution of NaOH, for instance, as an alkaline etching solution to remove processing damage thereof. In this alkaline etching step, surface roughness of etched wafer is so large that a cycle of the roughness is in the range of 10 to 20 $\mu$m in frequency and a P-V value thereof sometimes exceeds 1.5 $\mu$m.

Figure 21:
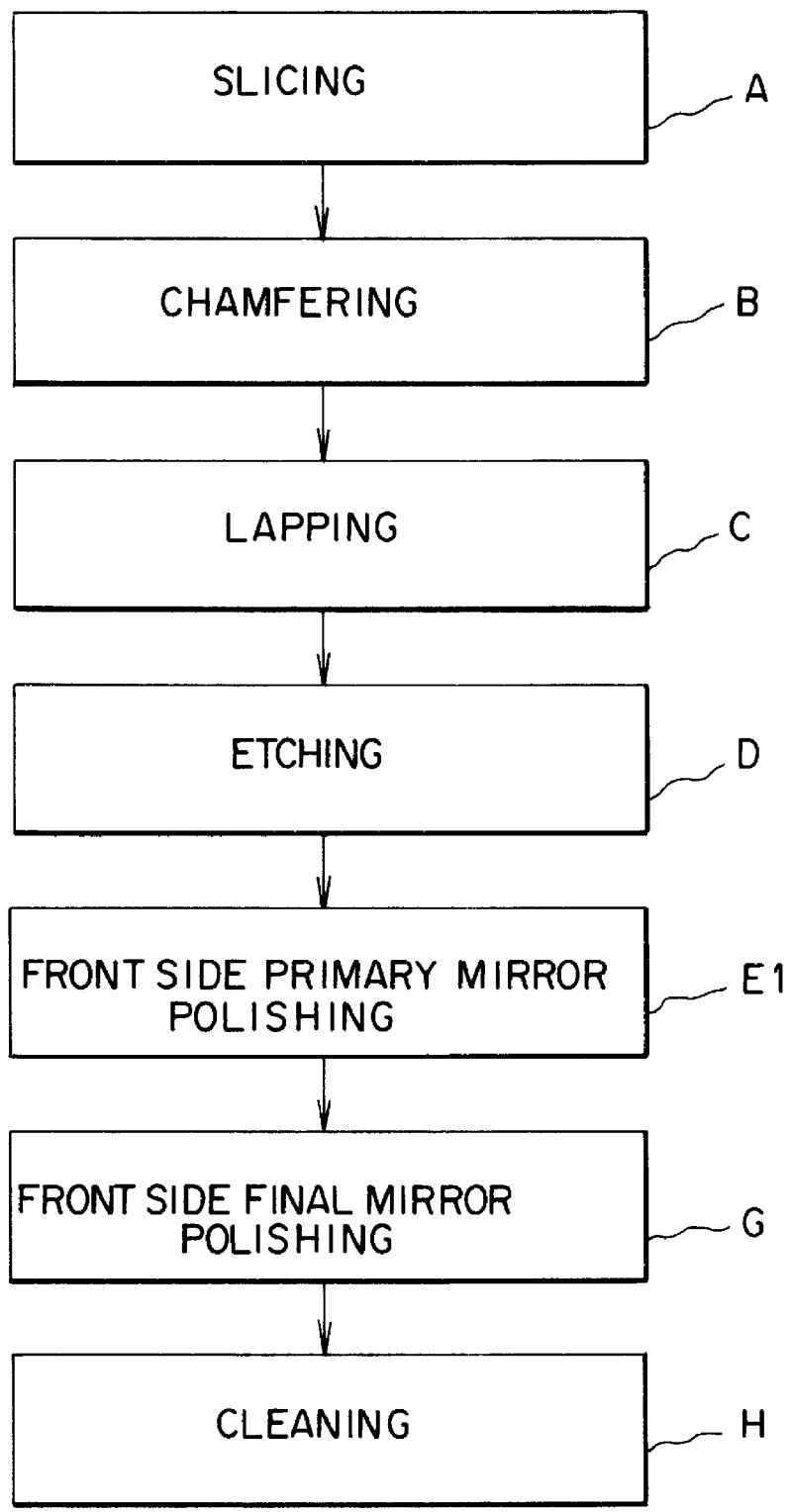
FIG. 21 is a flow chart showing one example of conventional manufacturing methods of semiconductor wafers.
Figure 22:
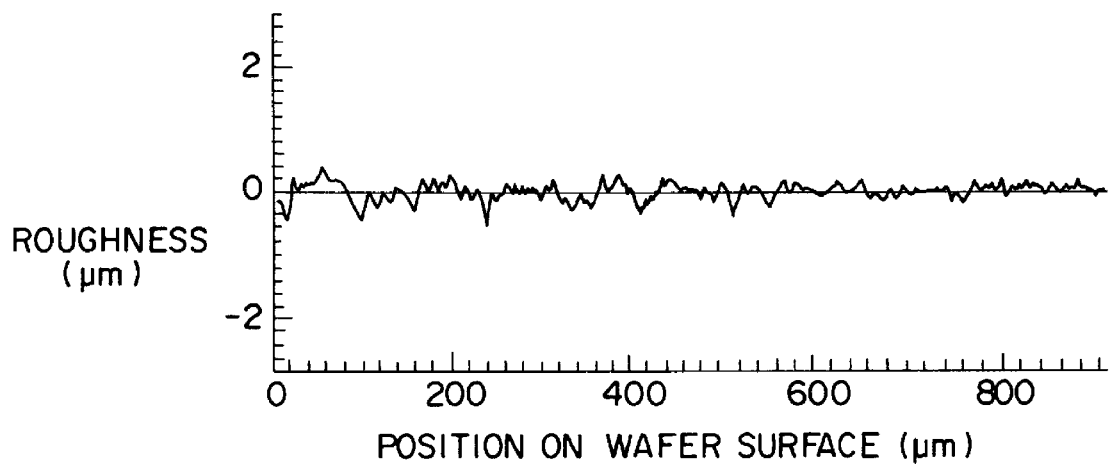
FIG. 22 is a graph showing distribution of the surface roughness of a wafer subjected to acid etching.
Figure 23:
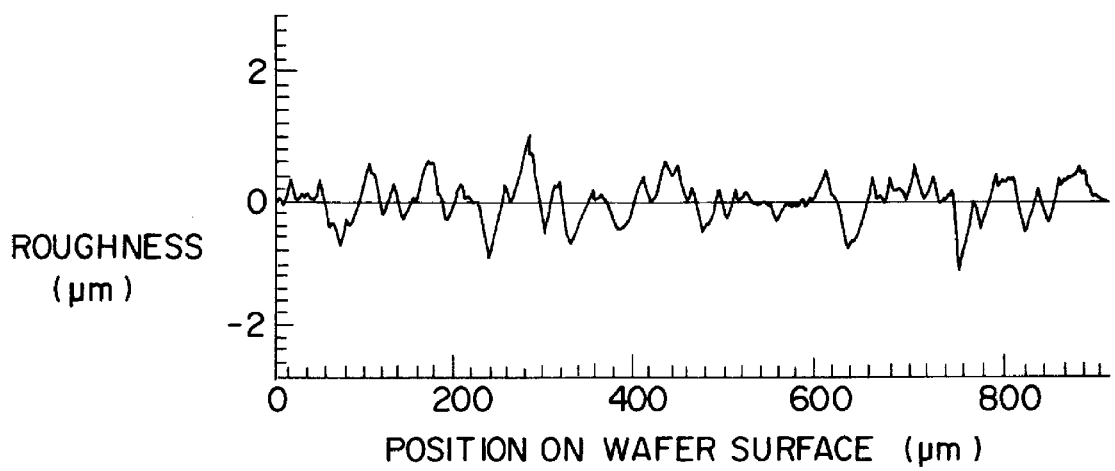
FIG. 23 is a graph showing distribution of the surface roughness of a wafer subjected to alkaline etching.

By the way, as shown in FIG. 21, in the conventional method, the wafer which has been etched in the etching step (D) to remove the processing damage is subjected to the front side primary mirror polishing step (El) and the front side final mirror polishing step (G) so as to mirror polish the front side thereof only. Surface roughness are generated on both sides of the wafer through the etching step. The surface roughness on the front side is removed by the above two mirror polishing steps (E1) and (G) but the surface roughness on the back side is left as etched to the final stage. Due to the surface roughness, the above noted problem has been seen.

Figure 14:
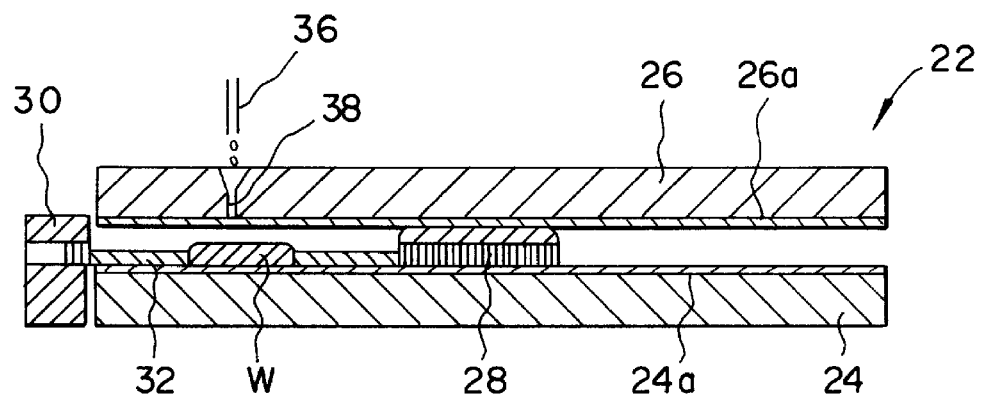
FIG. 14 is a cross sectional schematic view of a double side polishing machine.
Figure 15:
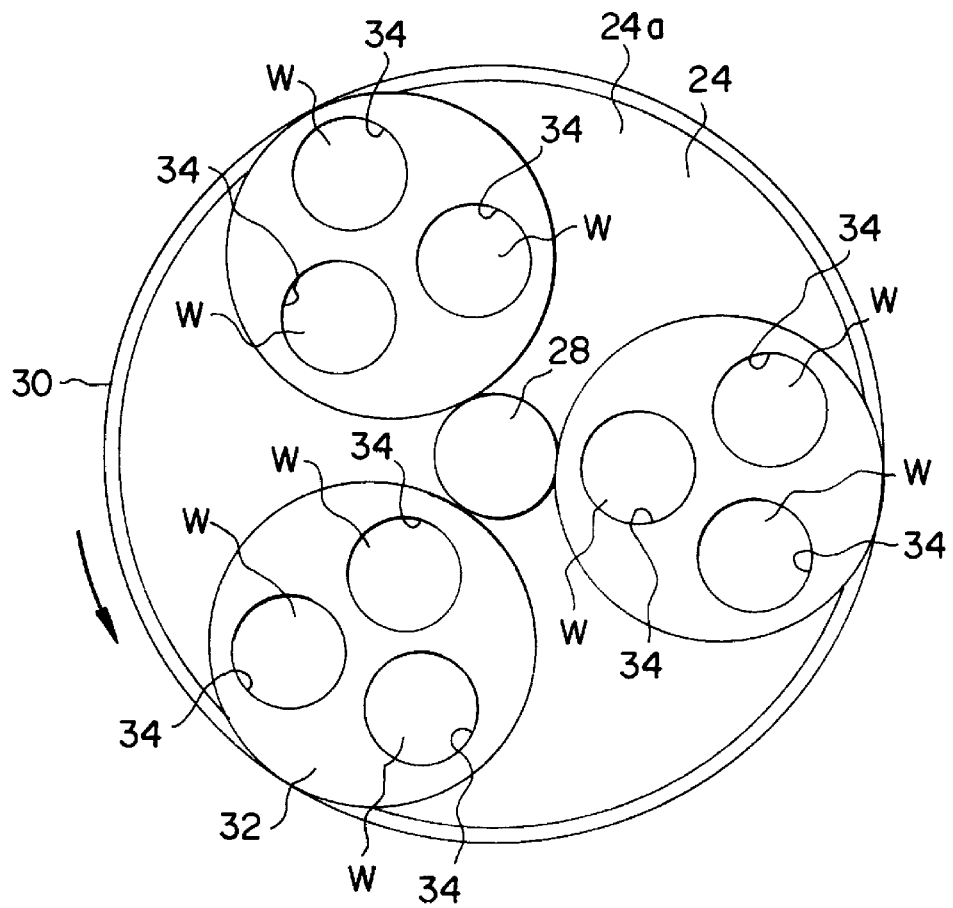
FIG. 15 is a schematic plan view showing a double side polishing machine in which an upper polishing turn table is removed.
Figure 16:
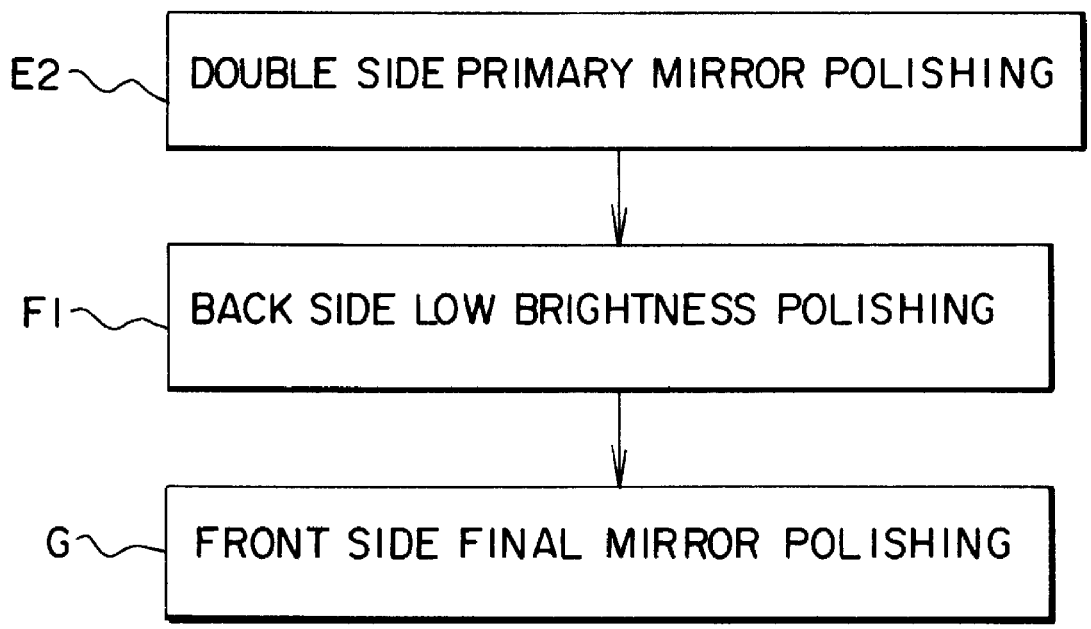
FIG. 16 is a flow chart showing the characterizing part of the first embodiment of the present invention.

With the problem in view, in an embodiment of the present invention, as shown in FIG. 16 after the etching step (D), a double side primary mirror polishing step (E2), a single (back) side low brightness polishing step (F1) and a single (front) side final mirror polishing step (G) are newly carried out in stead of a conventional polishing steps. In the double side primary mirror polishing step (E2), the etched wafer is primary mirror polished in terms of both sides thereof using a double side polishing machine as shown in FIGS. 14 and 15 and a polishing agent described later.

Figure 5:
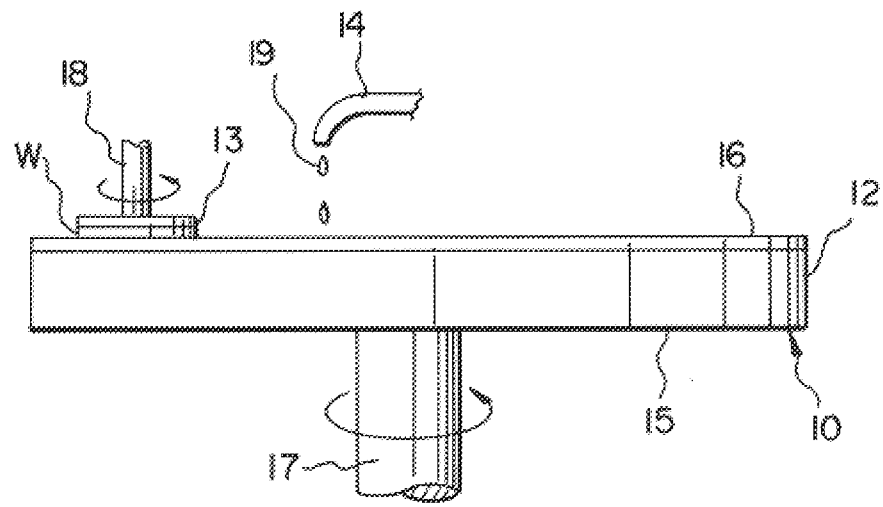
FIG. 5 is a schematic side view showing a single side polishing machine used in Experiments and Comparative Experiments.

In the single (back) side low brightness polishing step (F1), the wafer which has been double side primary mirror polished is low brightness polished in terms of the back side thereof using such a single side polishing machine 10 as shown in FIG. 5 and a silica containing polishing agent added with a polyolefin type fine particle material such as a low brightness polishing agent and polishing conditions shown in Experiment 1 described later. The wafer which has been low brightness polished in terms of back side thereof is then subjected to a single side final mirror polishing step (G) wherein one side (front side) thereof is mirror polished using a single side polishing machine as shown in FIG. 5 and a conventional polishing agent and a cleaning step (H) wherein the wafer is cleaned so as to remove the polishing agent or dust particles from its surface.

In the first embodiment of FIG. 1, as the back side of the wafer is low brightness polished, the brightness of the back side of the wafer is suppressed to about 95%. Thus, sensor detection of the front side and back side of the wafer on the basis of the brightness difference between both sides thereof becomes possible. The generation of dust is suppressed to such a low level as the number of the particles thereon is about 300 (see FIG. 10). Therefore, when the back side of the wafer is chucked in a photolithography process, the generation of dust by chipping can be suppressed and thereby the yield of semiconductor devices can be increased.

Figure 2:
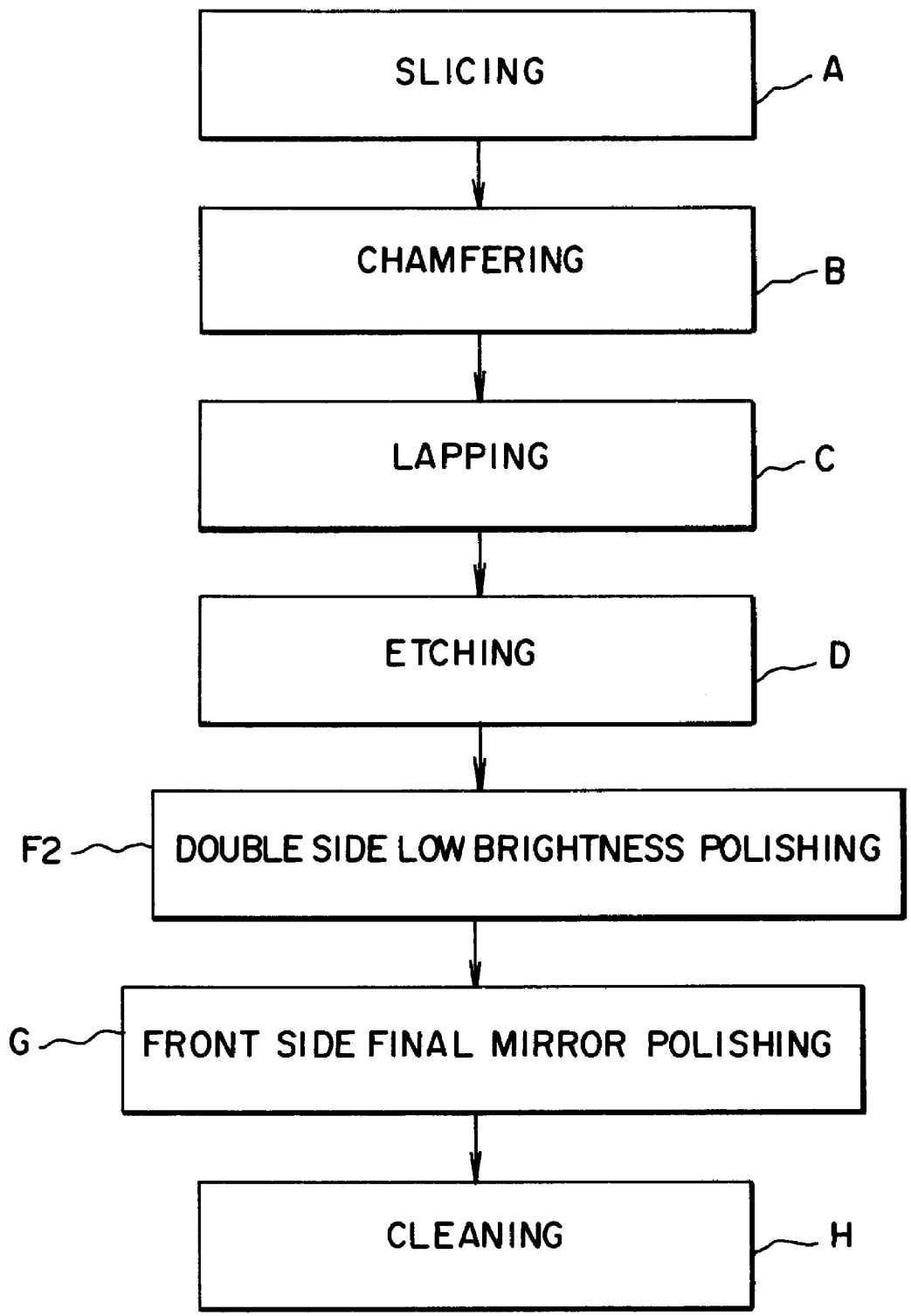
FIG. 2 is a flow chart showing the second embodiment of the present invention.

FIG. 2 is a flow chart showing the second embodiment of the present invention. In FIG. 2, a slicing step (A), a chamfering step (B), lapping step (C) and an etching step (D) are carried out according to the conventional steps as shown in FIG. 1.

Figure 17:
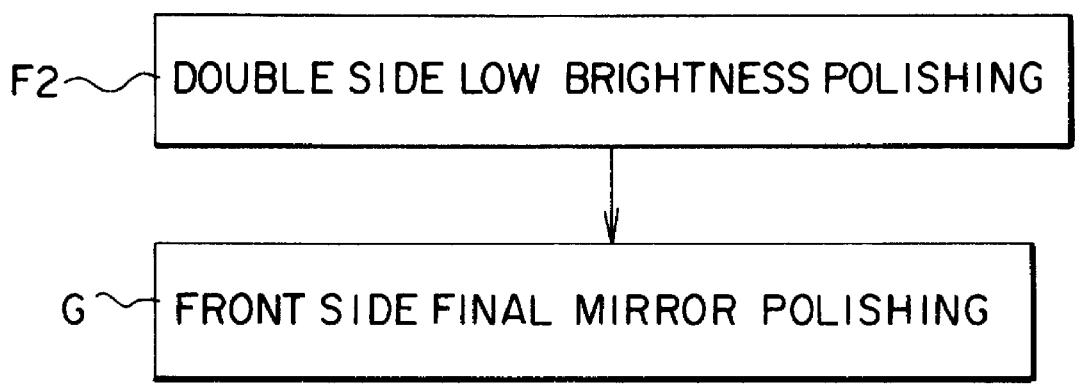
FIG. 17 is a flow chart showing the characterizing part of the second embodiment of the present invention.
Figure 18:
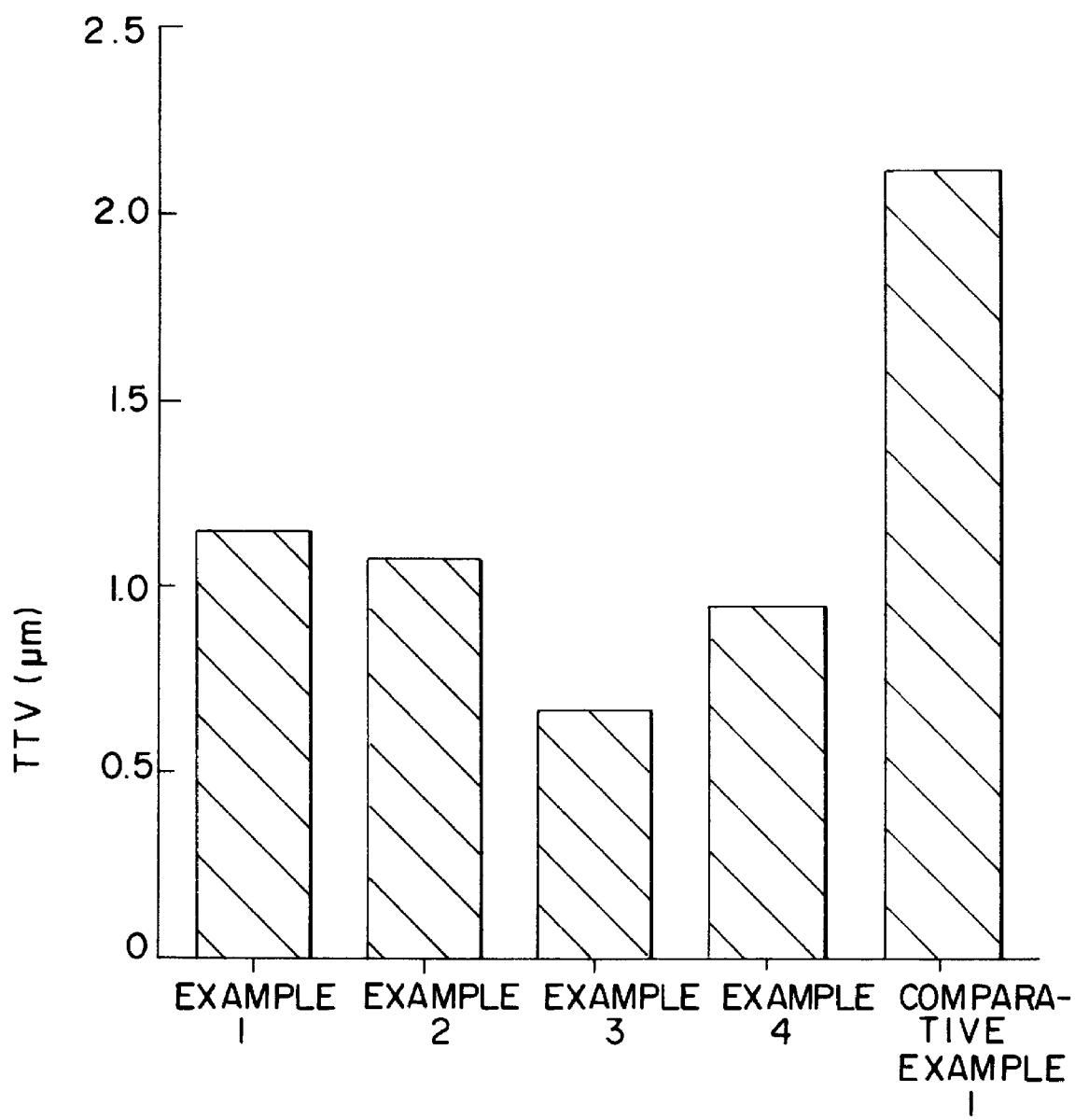
FIG. 18 is a graph showing results of the measurement on the flatness (LTV max) of wafer surfaces processed according to Examples 1 to 4, and Comparative Example 1.
Figure 19:
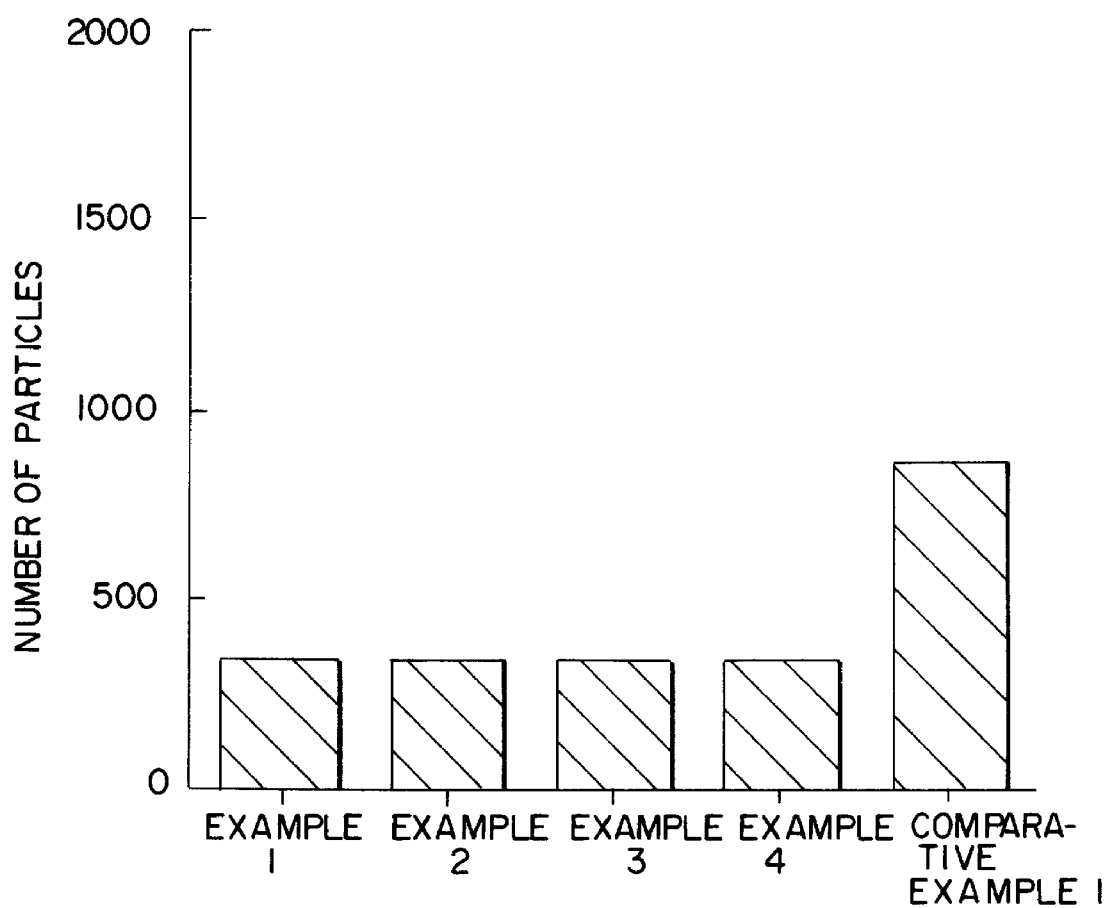
FIG. 19 is a graph showing results of the evaluation on the generation of dust particles of the wafer surfaces processed according to Examples 1 to 4 and Comparative Example 1.
Figure 20:
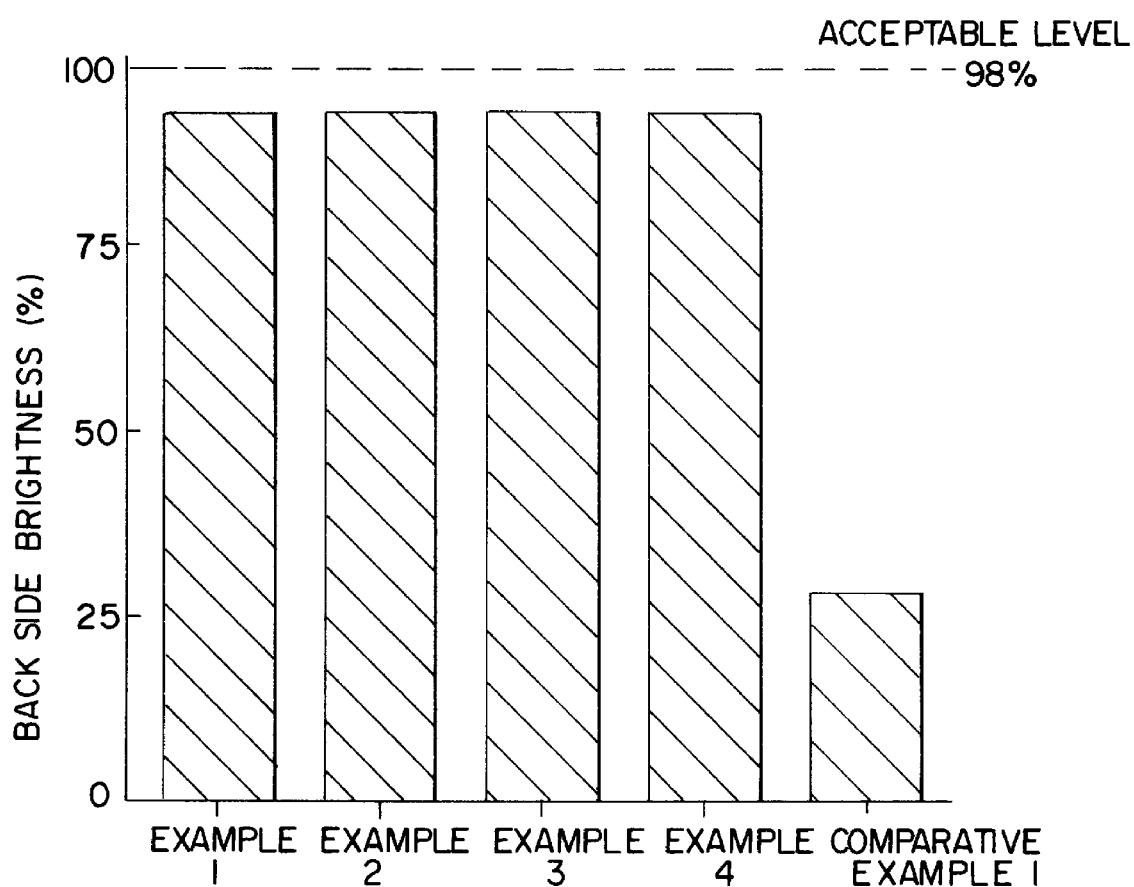
FIG. 20 is a graph showing results of the measurement on the brightness of wafer surfaces processed according to Examples 1 to 4 and Comparative Example 1.

In the second embodiment of the present invention, after the etching step (D) a double side low brightness polishing step (F2) and a single (front) side final mirror polishing step (G) are carried out instead of a conventional polishing step as shown in FIG. 17.

In the double side low brightness polishing step (F2), the etched wafer is low brightness polished in terms of both sides thereof using such a double side polishing machine as shown in FIGS. 14 and 15 and a silica containing polishing agent added with a polyolefin type fine particle material such as a low brightness polishing agent and polishing conditions shown in Experiment 1 described later. After that, a single (front) side final mirror polishing step (G) and a cleaning step (H) are carried out as in the first embodiment of FIG. 1.

In the second embodiment of FIG. 2, although the order of the steps thereof is different from that of the first embodiment, as the back side of the wafer is low brightness polished, the brightness of the back side of the wafer is suppressed to about 95%. Thus, sensor detection of the front side and back side of the wafer on the basis of the brightness difference between both sides thereof becomes possible. The front side of the wafer is final mirror polished to form a mirror surface same as a conventional one.

Figure 3:
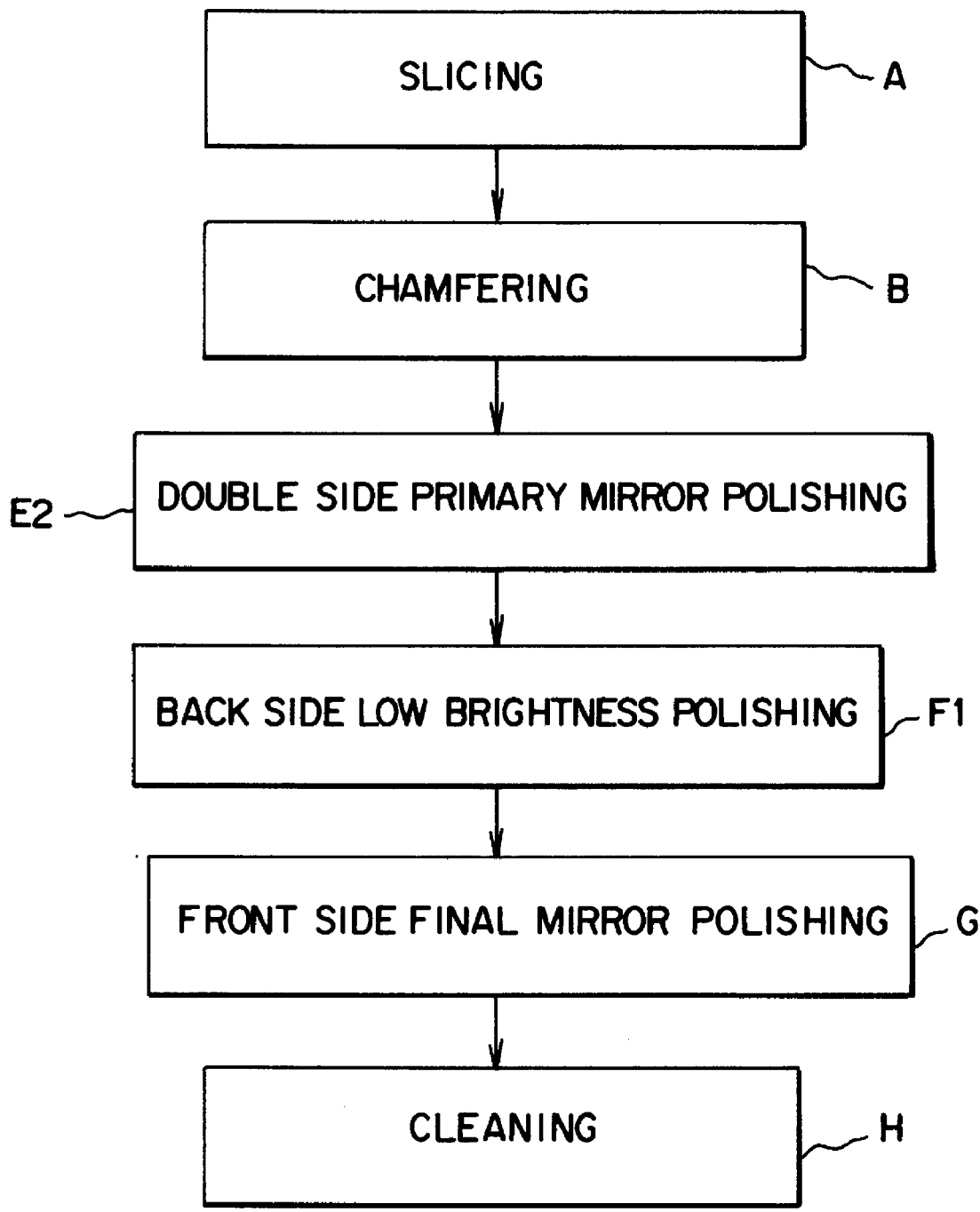
FIG. 3 is a flow chart showing the third embodiment of the present invention.

FIG. 3 is a flow chart showing the third embodiment of the present invention. In FIG. 3, a slicing step (A) and a chamfering step (B) are carried out as conventional ones, but a lapping step (C) and an etching step (P) are omitted.

In the third embodiment of the present invention, after the chamfering step (B), a double side primary mirror polishing step (E2) and a single (back) side low brightness polishing step (F1) are carried out and then a single (front) side final mirror polishing step (G) are carried out.

In the third embodiment of FIG. 3, although the order of the steps thereof is different from that of the first embodiment, as the back side of the wafer is low brightness polished, the brightness of the back side of the wafer is suppressed to about 95%. Thus, sensor detection of the front side and back side of the wafer on the basis of the brightness difference between both sides thereof becomes possible. The front side of the wafer is final mirror polished to form a mirror surface same as a conventional one.

Figure 4:
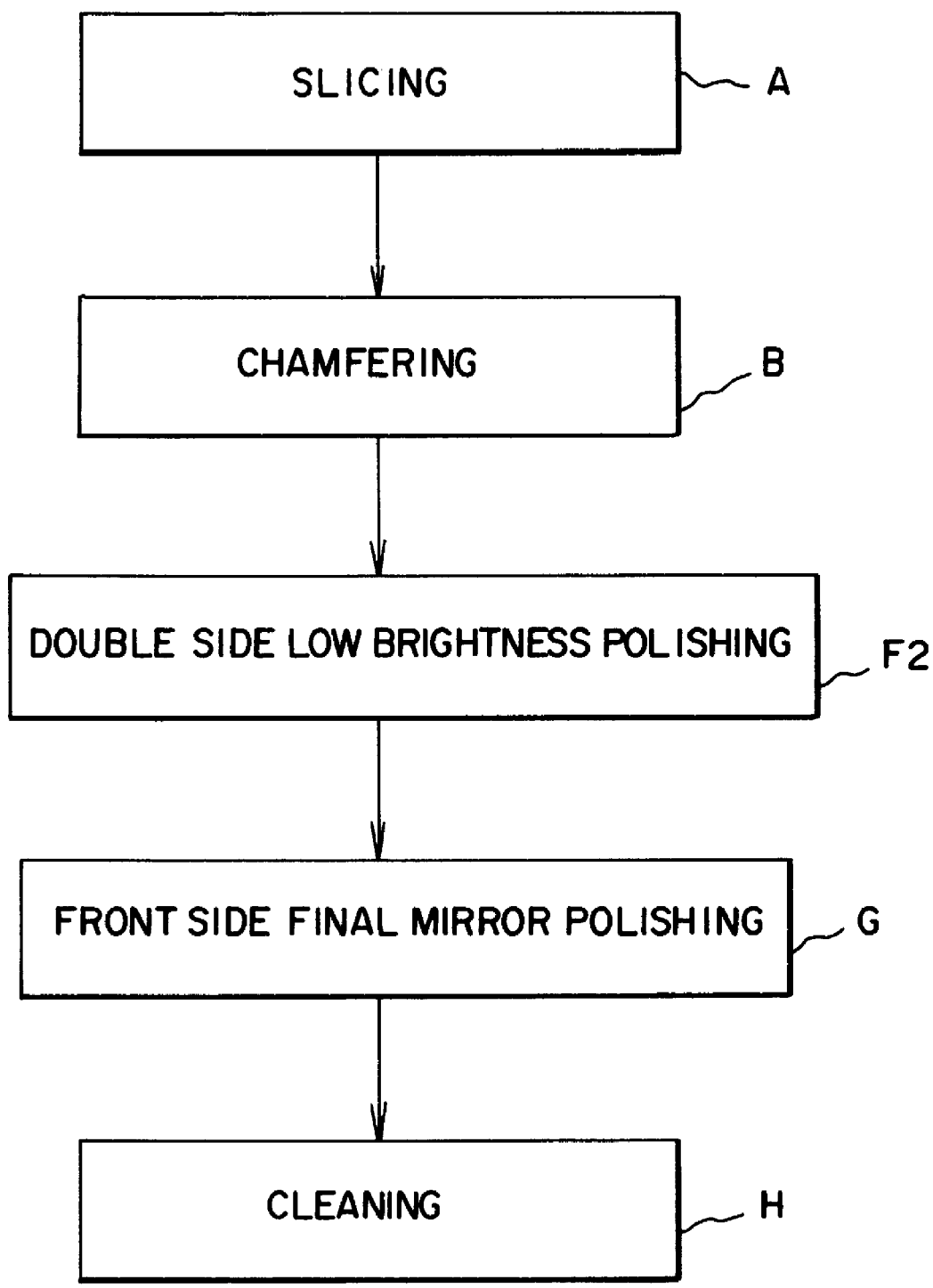
FIG. 4 is a flow chart showing the fourth embodiment of the present invention.

FIG. 4 is a flow chart showing the fourth embodiment of the present invention. In FIG. 4, a slicing step (A) and a chamfering step (B) are carried out, but a lapping step (C) and an etching step (D) are omitted as in the third embodiment of FIG. 3.

In the fourth embodiment of the present invention, after the chamfering step (B), a double side low brightness polishing step (F2) is carried out in stead of a double side primary mirror polishing step (E2) and a single (back) side low brightness polishing step (F1), and then a single (front) side final mirror polishing (G) and a cleaning step (H) are carried out.

In the fourth embodiment of FIG. 4, although the order of the steps thereof is different from that of the first embodiment, as the back side of the wafer is low brightness polished, the brightness of the back side of the wafer is suppressed to about 95%. Thus, sensor detection of the front side and back side of the wafer on the basis of the brightness difference between both sides thereof becomes possible. The front side of the wafer is final mirror polished to from a mirror surface same as a conventional one.

The low brightness polishing in the present invention will be described below in greater detail by way of the following Experiments and Comparative Experiments together with FIGS. 5~13.

FIG. 5 is a side elevation showing a conventional single side polishing machine used in Experiments and Comparative Experiments. In FIG. 5, the polishing machine 10 comprises a turn table assembly 12, a wafer holder 13, and a polishing agent supplying member 14. The turn table assembly 12 comprises a turn table 15 and a polishing pad 16 adhered on the upper surface of the turn table 15. The turn table 15 can rotate on a shaft 17 at a predetermined rotation speed by a driving device such as a motor. The wafer holder 13 is for holding with a vacuum chucking means or the like means to carry the wafer (W) on the polishing pad 16 of the turn table assembly 12 so that the surface of the wafer (W) faces to the polishing pad 16. The wafer holder 13 can rotate on a shaft 18 at a predetermined rotation speed and horizontally move on the polishing pad 16 by an appropriate driving device such as a motor. During operation of the polishing machine 10, the wafer (W) held by the wafer holder 13 is in contact with the polishing pad 16 and proper polishing loads are applied to the wafer (W) in a downward direction through the shaft 18 and the wafer holder 13. The polishing agent supplying member 14 is for supplying a polishing agent 19 on the polishing pad 16 to supply it between the wafer (W) and the polishing pad 16.

A double side polishing machine is used in Experiments described below. An example of the double side polishing machine is shown in FIGS. 14 and 15.

FIG. 14 is a cross sectional schematic view of the double side polishing machine and FIG. 15 is a schematic plan view showing the double side polishing machine in which an upper polishing turn table is removed. In FIG. 14, the double side polishing machine 22 comprises a lower polishing turn table 24 and an upper polishing turn table 26 which are faced each other vertically. A lower polishing pad 24a is adhered on the upper surface of a lower polishing turn table 24 and an upper polishing pad 26a is adhered on the lower surface of the upper polishing turn table 26. The lower polishing turn table 24 and the upper polishing turn table 26 are rotated oppositely each other by a driving means (not shown). The lower polishing turn table 24 has a central gear 28 which is provided on the upper surface of the central portion thereof and an annular internal gear 30 which is provided is proximity of the periphery thereof. Both the central gear 24 and the annular internal gear 30 are rotated independently of lower polishing turn table.

Reference numeral 32 denotes a carrier of disc type which is supported between the upper surface of the lower polishing pad 24a of the lower polishing turn table 24 and the lower surface of the upper polishing pad 26a of the upper polishing turn table 26 and rotates and revolves slidably between the lower polishing pad 24a and the upper polishing pad 26a under the action of the central gear 28 and the internal gear 30.

The carrier 32 has a plurality of wafer holes 34. Wafers (W) which are to be polished are set in the wafer holes 34. When the wafers (W) are polished, a polishing agent is supplied to spaces between the wafers (W) and the polishing pads 24a, 26a via hole 38 formed in the upper polishing plate 26 from a nozzle 36. As the carrier 32 rotates and revolves, the wafers (W) rotates and revolve slidably between the lower polishing pad 24a and the upper polishing pad 26a, thereby both the sides of the wafers (W) being polished.

Experiment 1

Condition

Sample wafers: Czochralski-grown p-type, <100>-oriented, 150-mm-diameter, single crystal silicon wafer Polishing pad: nonwoven fabric (velour-type), hardness= 80 (Asker C-scale, JISK-6301)

Polishing agent: 10.0 vol % of AJ-1325 ($SiO_2$ 2 wt %, pH=11, trade name for a colloidal silica polishing agent manufactured by Nissan Chemical Industries, Ltd.), a polyolefin type fine particle material [CHEMIPEARL S650 (trade name for a polyolefin aqueous dispersion manufactured by Mitsui Petrochemical Industries, Ltd.)] and pure water (the rest)

Polishing load: 400 g/cm$^2$

Polishing time: 10 min.

Under the condition specified above, the amount (wt %) of the polyolefin type fine particle material was changed with 0.025, 0.1, 0.45 and 1.0. Also, the amount of pure water was changed for the total amount of the polishing agent so as to become 100 vol %. Using the polishing apparatus 10 shown in FIG. 5, the surface of each sample wafer (twenty sheets for each test) was polished to measure the polishing rate in the polishing process. The results of the measurement are shown in FIG. 8.

Figure 8:
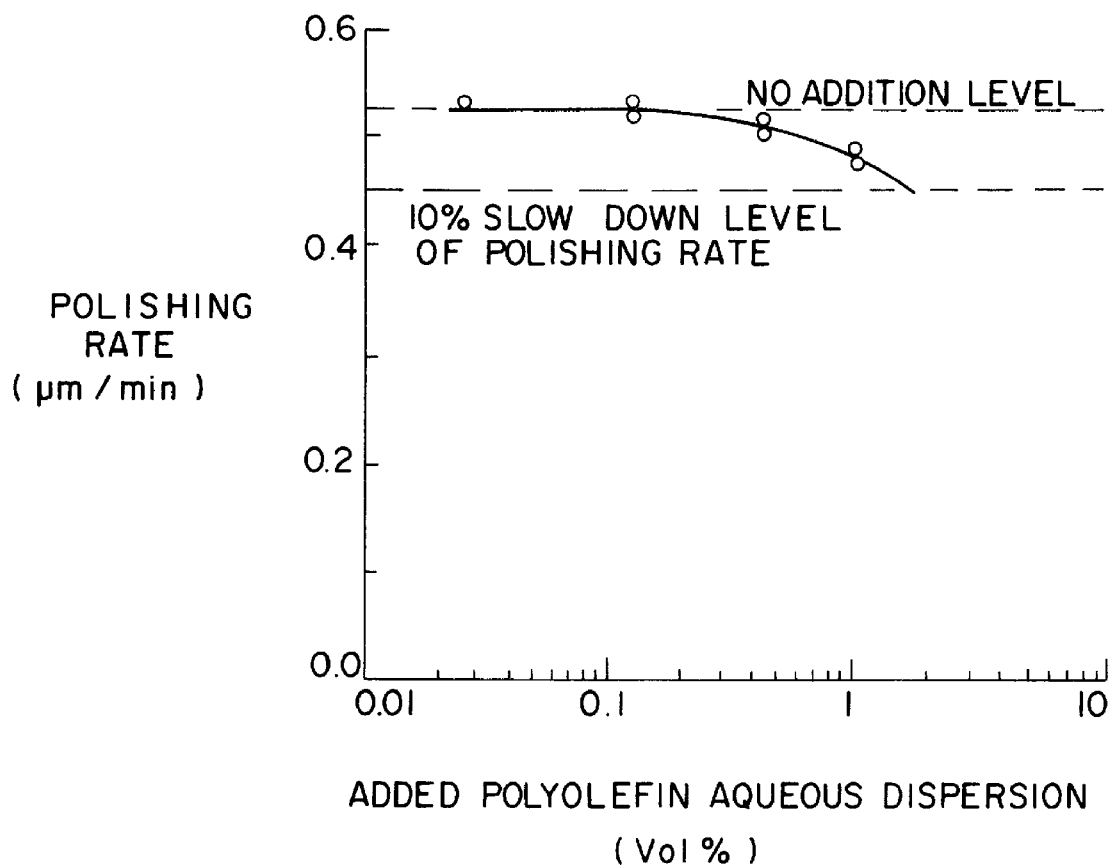
FIG. 8 is a graph of the relationship between the amount of the polyolefin type fine particle material and the polishing rate according to Experiment 1.

As is apparent from the results of FIG. 8, against the level that the polyolefin type fine particle material was not added, we found that the degradation of polishing rate was seen little when the amount of the material was added in the range of 0.01 to 0.1 wt %, and that the polishing process could be performed without serious degradation of the polishing rate if the material was added in the range of 0.1 to 1%.

Experiment 2

Figure 6:
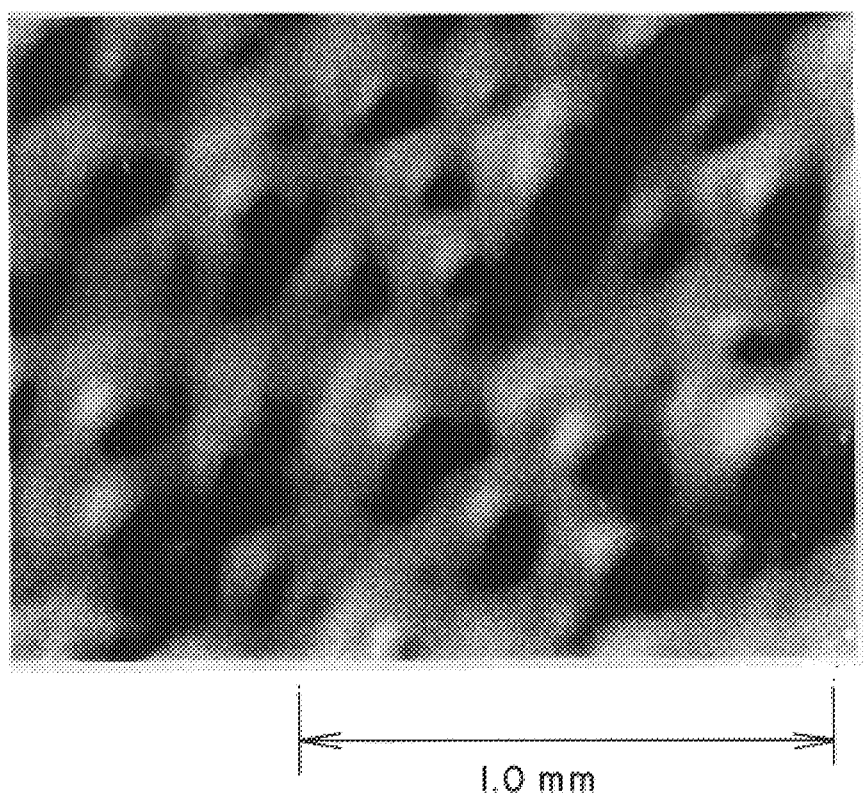
FIG. 6 is a photomicrograph of a wafer surface processed by low brightness polishing according to Experiment 2.
Figure 7:
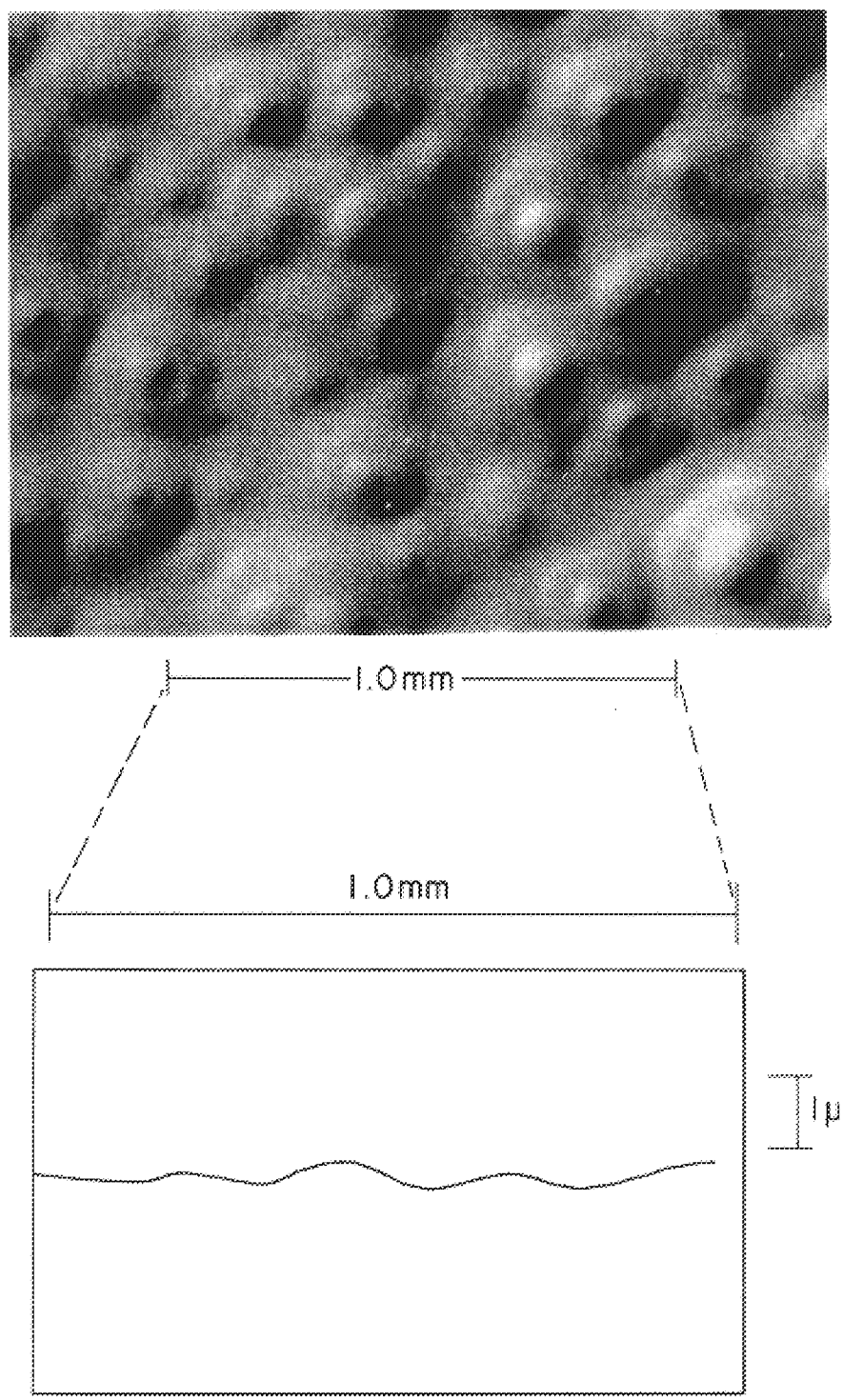
FIG. 7 is a photomicrograph and a graph showing the flatness of another surface portion of the wafer processed by low brightness polishing according to Experiment 2.

In the condition of Experiment 1, 0.025 wt % of CHEMIPEARL S650 (trade name for a polyolefin aqueous dispersion, manufactured by Mitsui Petrochemical Industries, Ltd.) was added while keeping the other conditions unchanged, and each sample wafer was then subjected to polishing. FIG. 6 is a photomicrograph of the surface of the sample wafer processed in Experiment 2. FIG. 7 is a photomicrograph of another surface portion of the same sample wafer together with a graph showing the undulations in the back surface measured by a surface roughness tester.

Figure 9:
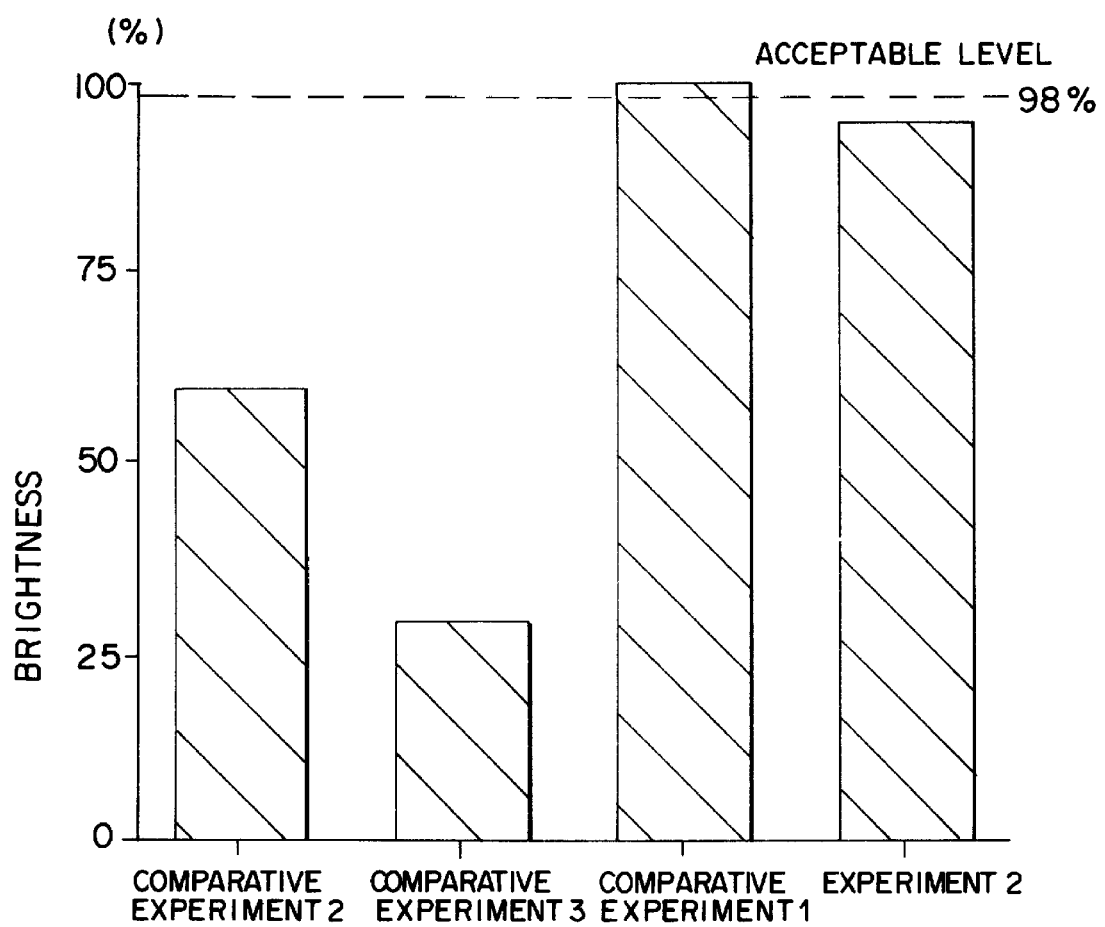
FIG. 9 is a graph showing results of the measurement on the brightness of wafer surface processed according to Experiment 1 and Comparative Experiments 1 to 3.

Further, the brightness of the back surface of the sample wafer was measured. The results of the measurement are shown in FIG. 9. As is apparent from FIG. 6 and 7, semi-spherical small projections having a diameter of 50 to 500 μm and a height of 0.05 to 0.5 μm were formed. Also, as is seen from FIG. 9, the brightness was 95% which led to the fact that the low brightness polishing could be achieved.

Figure 10:
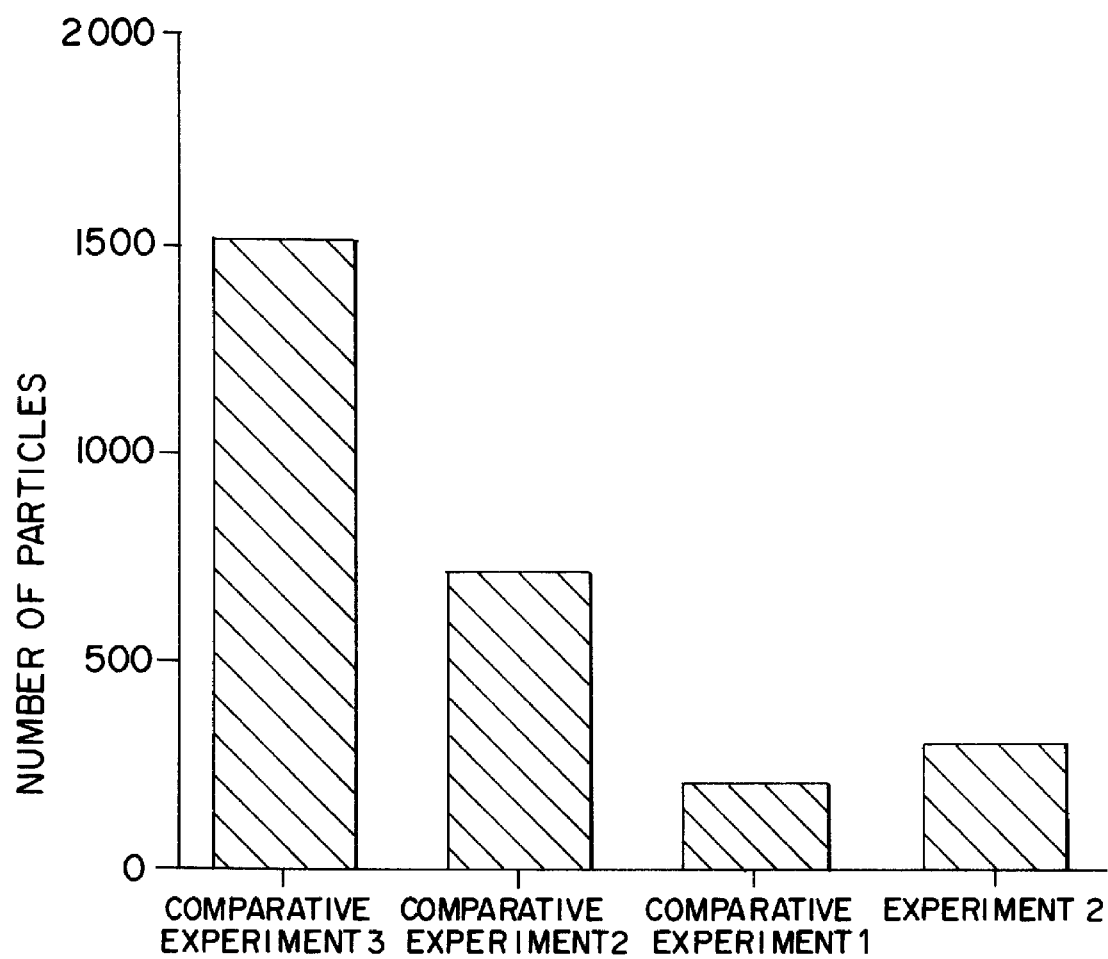
FIG. 10 is a graph showing results of the evaluation on the generation of dust of the wafer surfaces processed according to Experiment 1 and Comparative Experiments 1 to 3.
Figure 11:
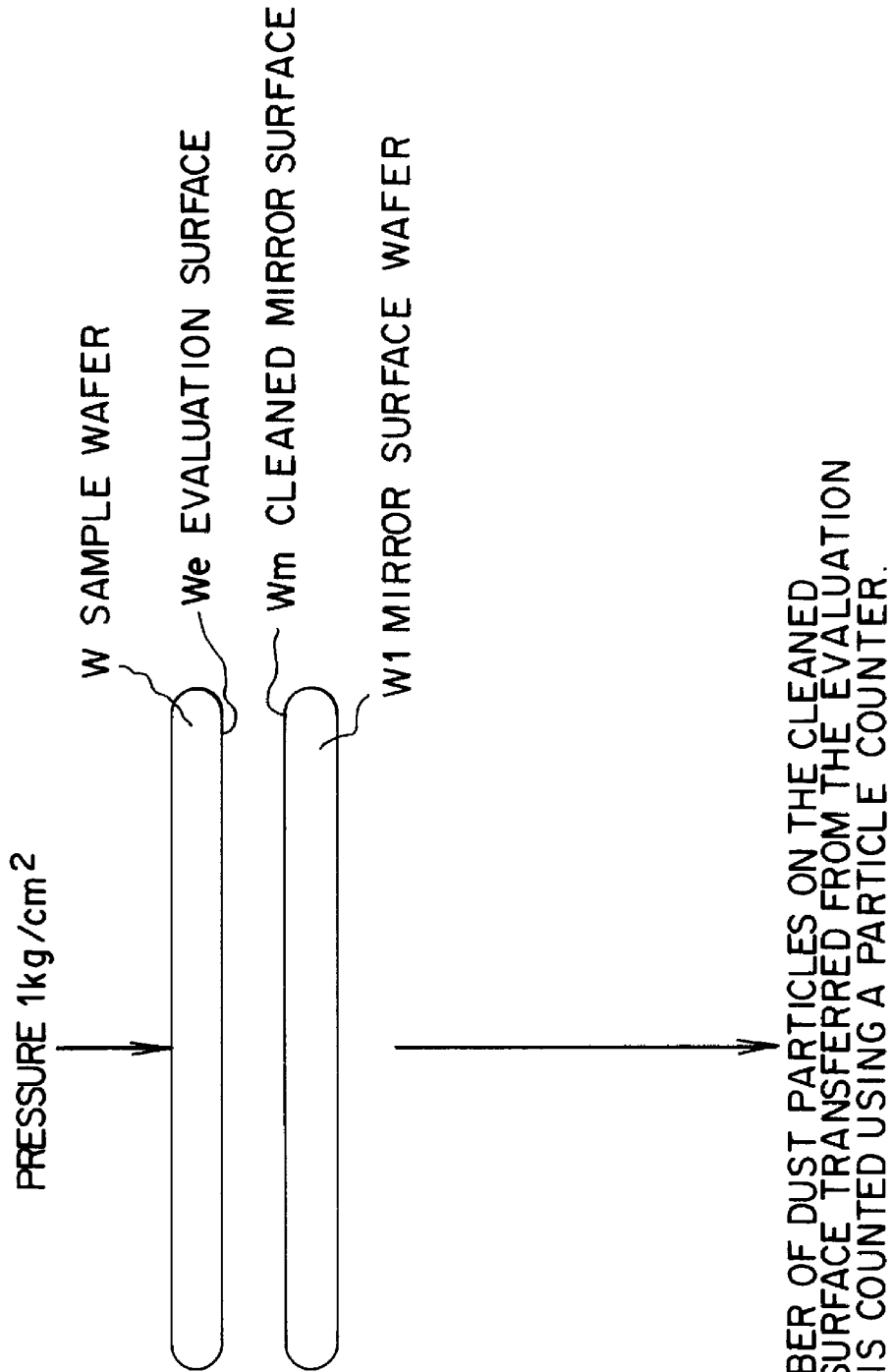
FIG. 11 is a diagram showing a method of evaluating the generation of dust particles of the wafer surfaces processed according to Experiment 2 and Comparative Experiments 1 to 3.

As shown in FIG. 11, a surface We for evaluation of the sample wafer W was pressed with load of 1 kg/cm$^2$ against a cleaned mirror surface Wm of a mirror surface wafer W1. After the pressing step, the number of dust particles (the number of particles whose size was larger than 0.1 μm) on the cleaned mirror surface Wm transferred from the evaluation surface We of the sample wafer W onto the cleaned mirror surface Wm of the mirror surface wafer W1 was counted using a particle counter. The results of the counting are shown in FIG. 10 in which the particle generation for the low brightness polished surface We of the sample wafer W was evaluated.

As is clearly seen from FIG. 10, the number of the particles on the low brightness polished surface We was about 300. The result was near the number (200) of particles on the mirror polished surface described below. Thus, we could found that the dust generation in this Example was very low.

Experiment 3

The same effect has been confirmed by experiments where a double side polishing machine 22 as shown in FIGS. 14 and 15 were used in place of the single side polishing machine 10 used in the experiments described above.

Comparative Experiment 1

In the polishing condition of Experiment 1, 10 vol % of AJ1325 (SiO$_2$ 2 wt %, pH=11, trade name for a colloidal silica polishing agent manufactured by Nissan Chemical Industries, Ltd.) and 90 vol % of pure water was used as the polishing agent while keeping the other condition unchanged, and both the front and back surfaces of each sample wafer were then subjected to mirror polishing.

Figure 12:
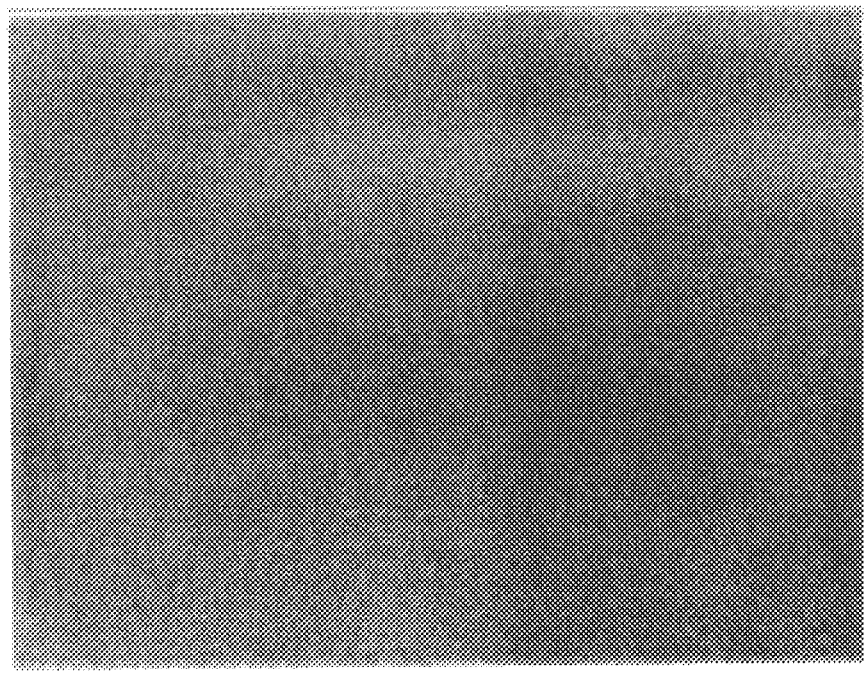
FIG. 12 is a photomicrograph of a wafer surface processed by mirror polishing according to Comparative Experiment 1.

FIG. 12 is a photomicrograph of the surface of the mirror polished wafer. The brightness was measured in the same manner as in Experiment 2, and the results of the measurement are shown in FIG. 9. Also, the evaluation on the particle generation was conducted in the same manner as in Experiment 2, and the results thereof are shown in FIG. 10. As is clearly seen from FIG. 12, undulations of large surface roughness on the mirror polished surface were not seen, and the brightness thereof was 100% as shown in FIG. 9. The number of particles counted to evaluate the dust generation was about 200 which was extremely low.

Comparative Experiment 2

Figure 13:
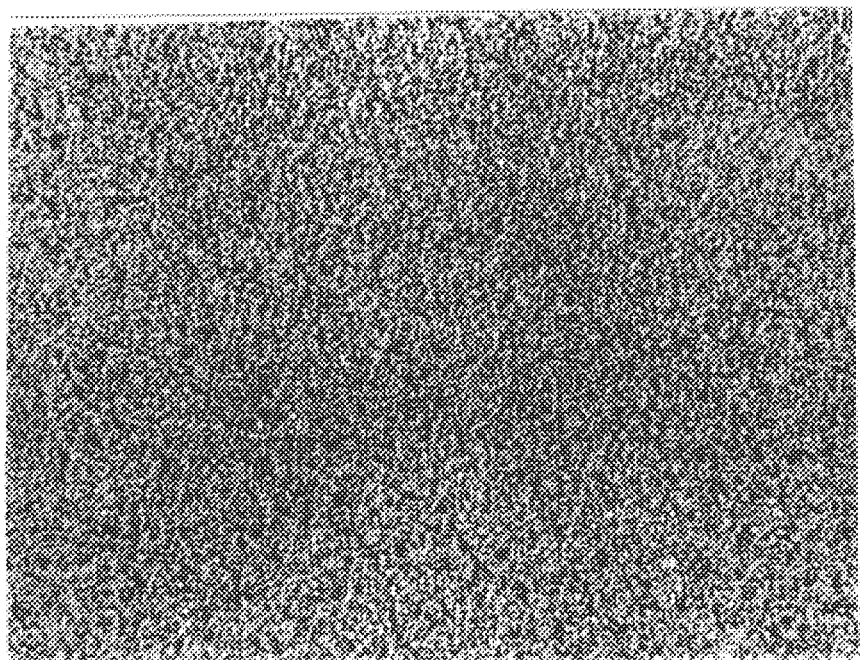
FIG. 13 is a photomicrograph of a wafer surface subjected to acid etching according to Comparative Example 2.

The same sample wafer as used in Experiment 1 was processed up to the etching process where acid etching was conducted. FIG. 13 is a photomicrograph of the acid etched surface of the sample wafer. As is apparent from FIG. 13, undulations of fine roughness were formed on the wafer surface, a cycle of which was less than 10 μm and a P-V (Peak to Valley) value of which was smaller than 0.6 μm. Also, the brightness on the acid etched surface of the sample wafer was measured, and the results of the measurement are shown in FIG. 9. The particle generation for the acid etched surface was then evaluated in the same manner as in Experiment 2, and the results thereof are shown in FIG. 10. The brightness of the acid etched surface was 60% which was lower than that in Experiment 2. However, the number of particles counted to evaluate the dust generation was about 700 which was quite higher than that obtained in Experiment 2.

Comparative Experiment 3

The same sample wafer as used in Experiment 1 was processed up to the etching process where alkaline etching was conducted. The brightness on the alkaline etched surface of the sample wafer was then measured, and the results of the measurement are shown in FIG. 9. Thereafter, the particle generation for the alkaline etched surface was evaluated in the same manner as in Experiment 2, and the results thereof are shown in FIG. 10. The brightness of the alkaline etched surface was 30% which was further lower than that in Comparative Experiment 2. However, the number of particles counted to evaluate the dust generation was about 1500 which was quite higher than that obtained in Comparative Experiment 2.

Example 1

Process: etching→double side primary mirror polishing→back side low brightness polishing→front side final mirror polishing Double side primary mirror polishing condition:
  Sample wafer: Czochralski-grown p-type, <100>-oriented, 150 mmϕ, etched silicon wafer
  Polishing pad: polyurethane foam, hardness=70 (Asker C-scale, JISK-6301)
  Polishing agent: 10.0 vol % of AJ-1325 (SiO$_2$ 2 wt %, pH=11, trade name for a colloidal silica polishing agent manufactured by Nissan Chemical Industries, Ltd.) and 90 vol % of pure water
  Polishing load: 100 g/cm$^2$
  Used sample wafers: 18 sheets Under the polishing condition specified above, using the double side polishing machine shown in FIGS. 14 and 15, each sample wafer was subjected to both side primary mirror polishing, then back side low brightness polishing as in Experiment 1 and further front side final mirror polishing as in Comparative Experiment 1. The polished wafer obtained by the above polishing process reached to the average flatness (TTV) of 1.2 μm, the average front side brightness of about 100%, the average number of particles on the back side of about 300 and the average back side brightness of about 95%.

Example 2

Process: etching→double side low brightness polishing→front side mirror polishing In the condition of the double side primary mirror polishing of Example 1, 0.025 wt % of CHEMIPEARL S650 (trade name for a polyolefin aqueous dispersion, manufactured by Mitsui Petrochemical Industries, Ltd.) was added while keeping the other conditions unchanged, and each sample wafer was then subjected to double side low brightness polishing. Thereafter, the sample wafer was subjected to front side final mirror polishing as in Comparative Example 1.

The polished wafer obtained by the above polishing process reached to the average flatness (TTV) of 1.1 μm, the average front side brightness of about 100%, the average number of particles on the back side of about 300 and the average back side brightness of about 95%.

Example 3

Process: slicing→chamfering→double side primary mirror polishing→back side low brightness polishing→front side final mirror polishing Double side primary mirror polishing condition:
  Sample wafer: Czochralski-grown p-type, <100>-oriented, 150 mmϕ, etched silicon wafer Polishing pad: polyurethane foam, hardness=80 (Asker C-scale, JISK-6301)

Polishing agent: 10.0 vol % of AJ-1325 ($SiO_2$ 2 wt %, pH=11, trade name for a colloidal silica polishing agent manufactured by Nissan Chemical Industries, Ltd.) and 90 vol % of pure water Polishing load: 100 g/cm$^2$ Used sample wafers: 18 sheets Under the polishing condition specified above, using the double side polishing machine shown in FIGS. 14 and 15, each sample wafer was subjected to both side primary mirror polishing, then back side low brightness polishing as in Experiment 1 and further front side final mirror polishing as in Comparative Experiment 1.

The polished wafer obtained by the above polishing process reached to the average flatness (TTV) of 0.7 μm, the average front side brightness of about 100%, the average number of particles on the back side of about 300 and the average back side brightness of about 95%.

Example 4

Process: slicing→chamfering→double side low brightness polishing→front side final mirror polishing In the condition of the double side primary mirror polishing of Example 1, 0.025 wt % of CHEMIPEARL S650 (trade name for a polyolefin aqueous dispersion, manufactured by Mitsui Petrochemical Industries, Ltd.) was added while keeping the other conditions unchanged, and each sample wafer was then subjected to double side low brightness polishing. Thereafter, the sample wafer was subjected to front side final mirror polishing as in Comparative Experiment 1.

The polished wafer obtained by the above polishing process reached to the average flatness (TTV) of 0.9 μm, the average front side brightness of about 100%, the average number of particles on the back side of about 300 and the average back side brightness of about 95%.

Comparative Example 1

Process (conventional): slicing→chamfering→lapping→acid etching→single side primary polishing→one side final polishing In the condition of the single side primary polishing of Comparative Experiment 1, hardness (Asker C-scale) of the polishing pad was changed to 80 while keeping the other conditions unchanged and each sample wafer was then subjected to single side primary polishing. Thereafter, in the condition of single side final polishing of Comparative Experiment 1, hardness (Asker C-scale) of the polishing pad was changed to 60 while keeping the other conditions unchanged and each sample wafer was subjected to single side final polishing.

The polished wafer obtained by the above polishing process reached to the average flatness (TTV) of 2.1 μm, the average front side brightness of about 100%, the average number of particles on the back side of about 800 and the average back side brightness of about 30%.

As stated above, the present invention is capable of low brightness polishing of the back side of the wafer, sensor detection of the front and back sides of the wafer, suppression of fine dust or particles generated by chipping of the back side of the wafer, thereby to increase the yield semiconductor devices, manufacturing mirror wafers with higher flatness level, and higher productivity due to simplification of processes.

Obviously, various minor changes and modifications of the present invention are possible in the light of the above teaching. It is therefore to be understood that within the scope of the appended claims the invention may be practiced otherwise than as specifically described.

What is claimed is:

1. A method of manufacturing semiconductor mirror wafers including a polishing step which is in a wafer manufacturing process and comprises the sub-steps of (a) double side primary mirror polishing of both front and back sides of a wafer, (b) single side low brightness polishing of the back side of the double side polished wafer, and (c) single side final mirror polishing of the front side of the single side low brightness polished wafer, wherein a semiconductor wafer polishing agent comprising a silica containing polishing agent as a main component and a polyolefin fine particle material as an additive is used for the single side low brightness polishing of the wafer.

2. A method of manufacturing semiconductor mirror wafers including a wafer polishing step which is in a wafer manufacturing process and comprises the sub-steps of (a) double side low brightness polishing of both front and back sides of a wafer, and (b) single side final mirror polishing of the front side of the double side low brightness polished wafer, wherein a semiconductor wafer polishing agent comprising a silica containing polishing agent as a main component and a polyolefin fine particle material as an additive is used for the double side low brightness polishing of the wafer.

3. A method of manufacturing semiconductor mirror wafers according to claim 1, wherein the wafer manufacturing process comprises the steps of (a) slicing a single crystal ingot to form wafers of thin disc shape, (b) chamfering a peripheral edge portion of the sliced wafer, (c) lapping the chamfered wafer to flatten the surface thereof, (d) etching the chamfered and lapped wafer to remove processing deformation thereof, and (e) polishing the etched wafer.

4. A method of manufacturing semiconductor mirror wafers according to claim 2, wherein the wafer manufacturing process comprises the steps of (a) slicing a single crystal ingot to form wafers of thin disc shape, (b) chamfering a peripheral edge portion of the sliced wafer, (c) lapping the chamfered wafer to flatten the surface thereof, (d) etching the chamfered and lapped wafer to remove processing deformation thereof, and (e) polishing the etched wafer.

5. A method of manufacturing semiconductor mirror wafers which comprises the steps of (a) slicing a single crystal ingot to form wafers of thin disc shape, (b) chamfering a peripheral edge portion of the sliced wafer, (c) double side primary mirror polishing of both front and back sides of a wafer, (d) single side low brightness polishing of the back side of the double side polished wafer, and (e) single side final mirror polishing of the front side of the single side low brightness polished wafer, wherein a semiconductor wafer polishing agent comprising a silica containing polishing agent as a main component and a polyolefin fine particle material as an additive is used for the single side low brightness polishing of the wafer.

6. A method of manufacturing semiconductor mirror wafers which comprises the steps of (a) slicing a single crystal ingot to form wafers of thin disc shape, (b) chamfering a peripheral edge portion of the sliced wafer, (c) double side low brightness polishing of both front and back sides of the chamfered wafer, and (d) single side final mirror polishing of the front side of the double side low brightness polished wafer, wherein a semiconductor wafer polishing agent comprising a silica containing polishing agent as a main component and a polyolefin fine particle material as an additive is used for the single side low brightness polishing of the wafer.

7. A method of manufacturing semiconductor mirror wafers according to claim 1, wherein the silica containing polishing agent is a colloidal silica polishing agent.

8. A method of manufacturing semiconductor mirror wafers according to claim 2, wherein the silica containing polishing agent is a colloidal silica polishing agent.

9. A method of manufacturing semiconductor mirror wafers according to claim 5, wherein the silica containing polishing agent is a colloidal silica polishing agent.

10. A method of manufacturing semiconductor mirror wafers according to claim 6, wherein the silica containing polishing agent is a colloidal silica polishing agent.

11. A method of manufacturing semiconductor mirror wafers according to claim 1, wherein the polyolefin fine particle material is a polyolefin aqueous dispersion.

12. A method of manufacturing semiconductor mirror wafers according to claim 2, wherein the polyolefin fine particle material is a polyolefin aqueous dispersion.

13. A method of manufacturing semiconductor mirror wafers according to claim 5, wherein the polyolefin fine particle material is a polyolefin aqueous dispersion.

14. A method of manufacturing semiconductor mirror wafers according to claim 6, wherein the polyolefin fine particle material is a polyolefin aqueous dispersion.

15. A method of manufacturing semiconductor mirror wafers according to claim 1, wherein the amount of the polyolefin fine particle material is in the range of 0.01 to 1 percent by weight relative to the total amount of the polishing agent.

16. A method of manufacturing semiconductor mirror wafers according to claim 2, wherein the amount of the polyolefin fine particle material is in the range of 0.01 to 1 percent by weight relative to the total amount of the polishing agent.

17. A method of manufacturing semiconductor mirror wafers according to claim 5, wherein the amount of the polyolefin fine particle material is in the range of 0.01 to 1 percent by weight relative to the total amount of the polishing agent.

18. A method of manufacturing semiconductor mirror wafers according to claim 6, wherein the amount of the polyolefin fine particle material is in the range of 0.01 to 1 percent by weight relative to the total amount of the polishing agent.

* * * * *